United States Patent
Chen et al.

(10) Patent No.: US 10,062,724 B1
(45) Date of Patent: Aug. 28, 2018

(54) IMAGE SENSOR AND SENSING PIXEL ARRAY FOR READING OUT CHARGE OF SENSING SIGNAL AND CHARGE OF RESET SIGNAL OF ONE SENSING PIXEL UNIT AFTER ANOTHER

(71) Applicant: PixArt Imaging Inc., Hsin-Chu (TW)

(72) Inventors: Peng-Sheng Chen, Hsin-Chu (TW); Jui-Te Chiu, Hsin-Chu (TW); Han-Chi Liu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 15/697,421

(22) Filed: Sep. 6, 2017

(30) Foreign Application Priority Data

Feb. 21, 2017 (TW) .............................. 106105724 A

(51) Int. Cl.
*H01L 27/146* (2006.01)
*H04N 3/14* (2006.01)

(52) U.S. Cl.
CPC ....... *H01L 27/14643* (2013.01); *H04N 3/155* (2013.01); *H01L 27/14612* (2013.01)

(58) Field of Classification Search
CPC ......... H01L 27/14603; H01L 27/14609; H01L 27/14612; H01L 27/14643
USPC ................................ 438/290, 291, 292, 293
See application file for complete search history.

(56) References Cited

U.S. PATENT DOCUMENTS

2017/0048475 A1* 2/2017 Sakuragi ........... H01L 27/14643
2017/0295338 A1* 10/2017 Geurts .................... H04N 5/363

\* cited by examiner

*Primary Examiner* — Brook Kebede
(74) *Attorney, Agent, or Firm* — Winston Hsu

(57) ABSTRACT

A sensing pixel array used in an image sensor includes sensing pixel units each including a photodiode, a row reset transistor, a buffer transistor, and a column control transistor at least. Photodiode converts light into a sensing signal. Row reset transistor is coupled to a reference reset signal and photodiode, and is controlled by a row reset signal. Buffer transistor is coupled to the output of photodiode to receive and buffer the sensing signal. Column control transistor is electrically connected to the control end or the output of the buffer transistor and is used as a switch which can be closed or open according to a column control signal to control whether to transfer charge of the reference reset signal to a capacitor when the row reset transistor becomes conductive.

10 Claims, 4 Drawing Sheets

IMAGE SENSOR AND SENSING PIXEL ARRAY FOR READING OUT CHARGE OF SENSING SIGNAL AND CHARGE OF RESET SIGNAL OF ONE SENSING PIXEL UNIT AFTER ANOTHER

BACKGROUND OF THE INVENTION

1. Field of the Invention

The invention relates to an image sensing mechanism, and more particularly to an image sensor and a sensing pixel array with a novel design structure.

2. Description of the Prior Art

Generally speaking, a scheme with a conventional sensing pixel structure is arranged to access or read out the charges of sensing signals and the charges of reset signals of different sensing pixel units and then to adopt multiple sets of capacitors (each set including two capacitors) to store these signal charges. For example, if a row select signal selects a particular row, the charges of sensing signals of different sensing pixel units on the same particular row are read out and stored/buffered in different capacitors among the multiple sets of capacitors, and then the charges of reset signals of the different sensing pixel units on the same particular row are read out and stored/buffered in other different capacitors among the multiple sets of capacitors. Thus, for the implementation of conventional sensing pixel structure, it is necessary for a charge access circuit to adopt the multiple sets of capacitors. This inevitably needs a large size circuit area and cannot meet demand trends of the design of a smaller size circuit.

SUMMARY OF THE INVENTION

Therefore one of the objectives of the invention is to provide an image sensor and sensing pixel array with a novel design structure, to solve the above-mentioned problems.

According to embodiments of the invention, an image sensor is disclosed. The image sensor comprises a plurality of sensing pixel units and a processing circuit. The sensing pixel unit comprises a photodiode, a row reset transistor, a buffer transistor, a storage capacitor, and a column control transistor. The photodiode is configured for converting light to generate a sensing signal. The row reset transistor has a first terminal coupled to a reference reset signal, a second terminal coupled to the photodiode, and has a control terminal which is controlled by a row reset signal. The buffer transistor has a control terminal coupled to an output of the photodiode to receive and buffer the sensing signal. The storage capacitor is electrically connected between the buffer transistor and a ground level and is configured for temporarily storing charge of the sensing signal. The column control transistor is electrically connected to the control terminal of the buffer transistor or an output of the buffer transistor, and is configured as a switch which is switched to become open or closed according to a column control signal corresponding to the sensing pixel unit wherein the column control transistor is used for controlling whether to transfer charge of the reference reset signal into the storage capacitor when the row reset transistor is conductive. The processing circuit is coupled to the sensing pixel units and is configured for generating the row reset signal and the column control signal.

According to the embodiments, a sensing pixel array used in an image sensor is disclosed. The sensing pixel array comprises a plurality of sensing pixel units. The sensing pixel unit comprises a photodiode, a row reset transistor, a buffer transistor, a storage capacitor, and a column control transistor. The photodiode is configured for converting light to generate a sensing signal. The row reset transistor has a first terminal coupled to a reference reset signal, a second terminal coupled to the photodiode, and a control terminal controlled by a row reset signal. The buffer transistor has a control terminal coupled to an output of the photodiode to receive and buffer the sensing signal. The storage capacitor is coupled between the buffer transistor and a ground level, and is configured for temporarily storing charge of the sensing signal. The column control transistor is electrically connected to the control terminal of the buffer transistor or an output of the buffer transistor, and is configured as a switch used to be switched to be open or closed according to a column control signal corresponding to the sensing pixel unit, to control whether to transfer charge of the reference reset signal to the storage capacitor when the row reset transistor is conductive.

In the above embodiments, the novel image sensor and/or the sensing pixel array having the design of novel sensing pixel units is/are provided. Each sensing pixel unit comprises a column control transistor so that the image sensor can output the charges of sensing signals and the charges of reset signals of different sensing pixel units on the same row one by one pixel unit through controlling the column control transistor of each sensing pixel unit to. Compared to the conventional scheme, the novel image sensor and/or corresponding sensing pixel array require (s) merely one set of analog receiving circuit such as only one set of two sample capacitors to receive the charges of sensing signals and charges of reset signals, without using N sets of sample capacitors to respectively receive the charges of sensing signals and charges of reset signals of multiple different sensing pixel units on the same row. Accordingly, the novel image sensor and/or corresponding sensing pixel array can provide the advantages of smaller circuit size and lower circuit costs.

These and other objectives of the present invention will no doubt become obvious to those of ordinary skill in the art after reading the following detailed description of the preferred embodiment that is illustrated in the various figures and drawings.

DETAILED DESCRIPTION

In embodiments of the invention, the positions of column control transistors in the image sensors can be designed or configured in different positions. In the following, a variety of embodiments of image sensors and/or sensing pixel array are provided.

Figure 1:
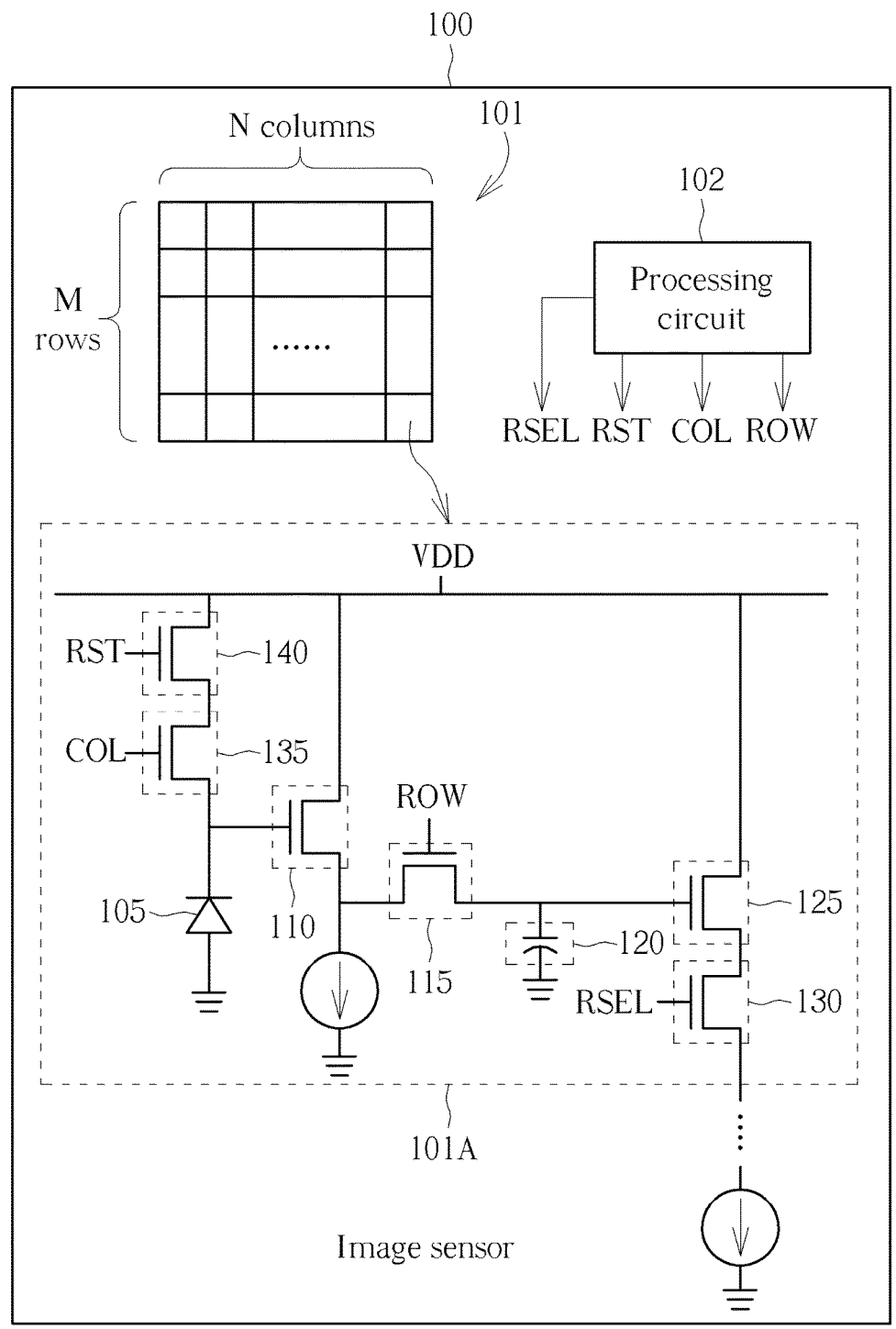
FIG. 1 is a circuit diagram of an image sensor according to a first embodiment of the invention.

Refer to FIG. 1, which is a circuit diagram of an image sensor 100 according to a first embodiment of the invention. The image sensor 100 comprises a sensing pixel array 101 and a processing circuit 102. The sensing pixel array 101 comprises a plurality of sensing pixel units 101A such as M*N sensing pixel units including M rows and N columns. Each sensing pixel unit 101A comprises a photodiode 105, a buffer transistor 110, a transfer transistor 115, a storage capacitor 120, a read transistor 125, a row select transistor 130, a row reset transistor 140, and a column control transistor 135 wherein the row reset transistor 140 and column control transistor 135 are connected in series. The photodiode 105 is configured for converting light into a voltage signal or a current signal to generate a sensing signal. The buffer transistor 110 has a control terminal coupled to an output of the photodiode 105 to receive and buffer the charge of the sensing signal. The first terminal of buffer transistor 110 is coupled to the supply voltage VDD, and its second terminal is coupled to a current source. The charge of sensing signal buffered by the transistor 110 is outputted via the second terminal. The transfer transistor 115 has a control terminal coupled to and controlled by a row control signal ROW, and also has a first terminal coupled to the output of the buffer transistor 110 and a second terminal coupled to the storage capacitor 120. The transfer transistor 115 is used as a transmission channel or transmission path, which is arranged for transferring received signal charge such as the charge of sensing signal when the transistor 115 is conductive and arranged for not transferring the received signal charge when the transistor 115 is nonconductive. In this embodiment, the transfer transistor 115 is optional. The storage capacitor 120 is coupled between the transfer transistor 115 and a ground level and is used for temporarily storing signal charge such as the charge of sensing signal. The read transistor 125 has a control terminal coupled to the storage capacitor 120 and is used as a source follower. The row select transistor 130 has a control terminal coupled to and controlled by a row select signal RSEL and has a first terminal coupled to the output of the read transistor 125. The charge of sensing signal of sensing pixel unit 101A, which has been temporarily stored in the capacitor 120, is read out through the read transistor 125 and row select transistor 130 and then is outputted to a subsequent analog receiving circuit such as a first capacitor (not shown in FIG. 1).

The row reset transistor 140 has a control terminal coupled to and controlled by a row reset signal RST. The column control transistor 135 is used as a switch which can be switched to open or closed in accordance with a column control signal COL corresponding to the sensing pixel unit 101A. For example, after the subsequent analog receiving circuit has received and stored the charge of sensing signal of the sensing pixel unit 101A, corresponding charge of a reset signal can be obtained by resetting the sensing pixel unit 101A, and a second capacitor (not shown in FIG. 1) can be employed for receiving the corresponding charge of reset signal. When the row reset signal RST controls the row reset transistor 140 to be conductive, the column control signal COL can be arranged to control the column control transistor 135 to be conductive to reset the sensing pixel unit 101A. In this situation, the reference reset signal (i.e. supply level VDD) is transmitted to the control terminal of buffer transistor 115, and is transmitted to the storage capacitor 120 via the buffer transistor 110 and transfer transistor 115. The reference reset signal VDD is then read out through the read transistor 125 and row select transistor 130 and is outputted to the subsequent analog receiving circuit such as the above-mentioned second capacitor.

Instead, even though the row reset signal RST controls the row reset transistor 140 to be conductive, the column control signal COL can be arranged to control the column control transistor 135 to be nonconductive (not conductive) to not transmit the reference reset signal to the control terminal of buffer transistor 110 so as to not reset the sensing pixel unit 101A. It should be noted that the control signals RST, COL, ROW, and RSEL for each of the sensing pixel units 101A can be generated by the processing circuit 102.

The subsequent analog receiving circuit is arranged to employ one set of two capacitors such as the above-mentioned first and second capacitors to receive and store the charge of a sensing signal and the charge of a reset signal for a certain sensing pixel unit. Then the charge of sensing signal and the charge of reset signal can be converted into two digital values by an analog-to-digital conversion circuit, and the two digital values can be stored in a memory device. Thus, the charges previously stored by the set of two capacitors such as the above-mentioned first and second capacitors can be cleared and then used for receiving and storing charge of a sensing signal and charge of a reset signal for a next sensing pixel unit. In this way, in response to the design of the image sensor 100, the analog receiving circuit can be implemented by using merely one set of two capacitors to respectively receive the charges of sensing signals and reset signals generated by different sensing pixel units on the same row one pixel unit by one pixel unit. Compared to the conventional scheme, it is not required for the implementation of image sensor 100 to adopt N sets of capacitors to receive the charges generated by different sensing pixel units on the same row simultaneously.

Figure 4:
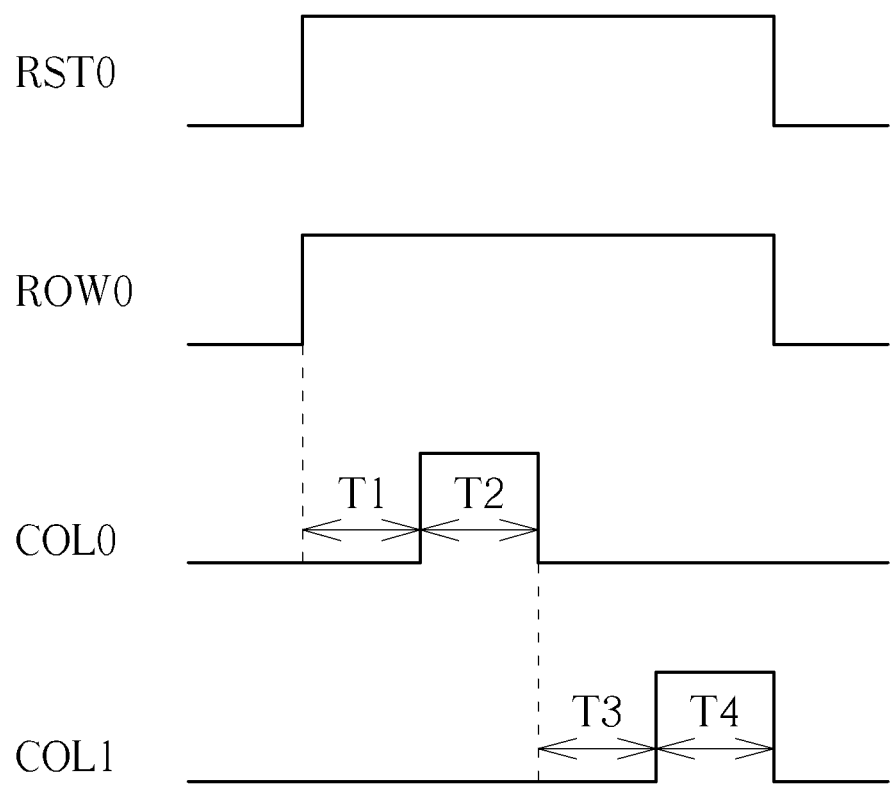
FIG. 4 is a simplified signal diagram illustrating the operation of image sensor of FIG. 1 to reset two different sensing pixel units on the same row during an assertion of the same row select signal.

Refer to FIG. 1 in conjunction with FIG. 4. FIG. 4 is a simplified signal diagram illustrating the operation of image sensor 100 of FIG. 1 to reset two different sensing pixel units on the same row during an assertion of the same row select signal. Signal ROW0 is a row select signal. When the row select signal is asserted, the image sensor 100 is arranged to read out the charges of sensing signals and the charges of reset signals of different sensing pixel units on a particular row corresponding to the row select signal ROW0. FIG. 4 shows the timing sequence for reading the charges of sensing signals and the charges of reset signals of two different sensing pixel units on the particular row. Signal RST0 indicates a row reset signal, and signals COL0 and COL1 respectively indicate column control signals of the two different sensing pixel units.

As mentioned above, when both the row reset signal RST0 and column control signal COL0 are asserted (e.g. the time period T2), the row reset transistor 140 and column control transistor 135 of a corresponding sensing pixel unit associated with the column control signal COL0 on the particular row are turned on to become conductive, so as to connect the supply voltage VDD to the control terminal of buffer transistor 110 of the corresponding sensing pixel unit to make the storage capacitor 120 store the charge of the reset signal. Instead, when the column control signal COL0 is not asserted, even the row reset signal RST0 and row control signal ROW0 are asserted, the supply voltage VDD is disconnected from the control terminal of buffer transistor 110, and the charge of the sensing signal stored in the storage capacitor 120 will not be cleared. The corresponding sensing pixel unit associated with the column control signal COL0 on the particular row can be arranged to perform photo sensing to generate the charge of a sensing signal during the time period T1.

Similarly, when the row reset signal RST0 and another column control signal COL1 are asserted (e.g. time period T4), the row reset transistor 140 and column control transistor 135 of another corresponding sensing pixel unit associated with the column control signal COL1 on the particular row are turned on to become conductive, so as to connect the supply voltage VDD to the control terminal of buffer transistor 110 of the another corresponding sensing pixel unit to clear the charge of a sensing signal stored by the storage capacitor 120 of the another corresponding sensing pixel unit and to store charge of a reset signal. When the column control signal COL1 is not asserted, even the row reset signal RST0 and row control signal ROW0 are asserted, the supply voltage VDD is disconnected from the control terminal of buffer transistor 110, and the charge of sensing signal stored in the storage capacitor 120 will not be cleared. The another corresponding sensing pixel unit associated with the column control signal COL0 on the particular row can be arranged to perform photo sensing during the time period T3 to generate the charge of a sensing signal.

Thus, by employing different column control signals to control the column control transistors of multiple different sensing pixel units on the same row, the sensing pixel units one by one can be arranged to perform photo sensing, charge storage, and charge reset operations when the same row select signal RSEL corresponding to the different sensing pixel units is asserted. For example, when the row select signal RSEL of the first row is asserted, a sensing pixel unit corresponding to a first column on the first row can be arranged to perform photo sensing, charge storage, and charge reset operations, and output the sensed charge and reset charge to a subsequent analog-to-digital conversion circuit. Then, a sensing pixel unit corresponding to a second column on the first row can be arranged to perform photo sensing, charge storage, and charge reset operations, and output the sensed charge and reset charge to the subsequent analog-to-digital conversion circuit. By doing so, the subsequent analog-to-digital conversion circuit can use only one the same analog receiving circuit to receive signal charges of sensing pixel units corresponding to different columns on the same row. For example, the subsequent analog-to-digital conversion circuit may use two capacitor elements to respectively receive sensed charge and reset charge for the above-mentioned first sensing pixel unit at a first timing, and then use the same capacitor elements to respectively receive sensed charge and reset charge for the above-mentioned second sensing pixel unit at a second timing following the first timing. Compared to the conventional image sensing scheme needing to adopt multiple analog receiving circuits to respectively receive sensed charge and reset charge of different sensing pixel units on the same row, the image sensor 100 can provide the advantage of extremely low circuit manufacturing costs.

It should be noted that the signal simplified diagram of FIG. 4 is used as an example for illustrating the photo sensing and charge reset operations performed upon different sensing pixel units on the same row sequentially at different timings so that the readers can clearly distinguish the operations of the embodiment from the conventional scheme which simultaneously resets different sensing pixel units on the same row. The example of FIG. 4 is not meant to be a limitation.

Further, in other modification embodiments, for example, the column control transistor 135 can be configured to be connected between the supply voltage VDD and the row reset transistor 140, and the row reset transistor 140 can be configured to be connected between the column control transistor 135 and the control terminal of buffer transistor 110. The modifications also fall within the scope of the invention.

Figure 2:
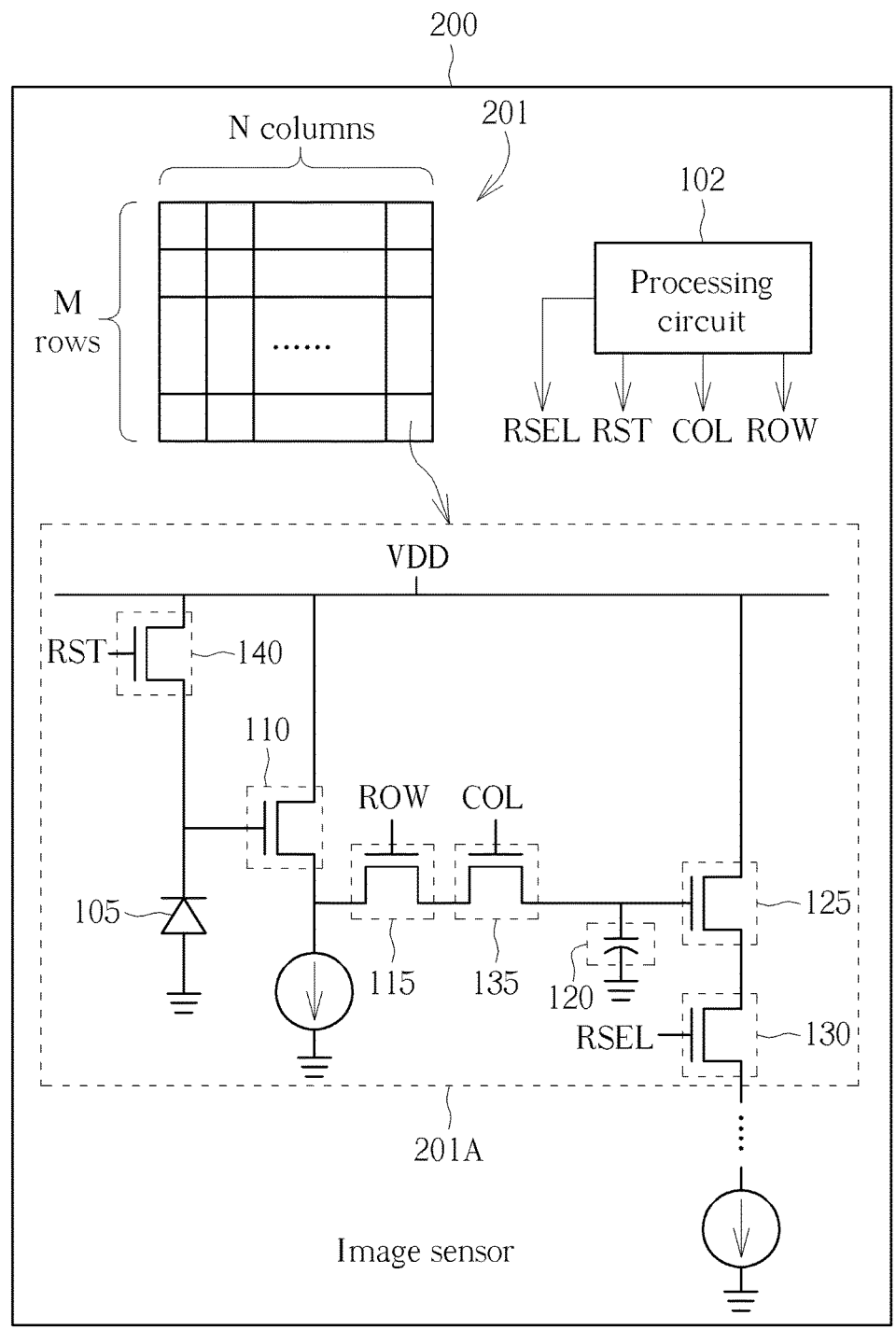
FIG. 2 is a circuit diagram of an image sensor according to a second embodiment of the invention.

Further, the column control transistor 135 can be changed to be configured between the output terminal of buffer transistor 110 and the transfer transistor 115. Alternatively, the column control transistor 135 can be changed to be configured between the transfer transistor 115 and the read transistor 125. Refer to FIG. 2, which is a circuit diagram of an image sensor 200 according to a second embodiment of the invention. The image sensor 200 comprises a sensing pixel array 201 and the processing circuit 102. The sensing pixel array 201 comprises a plurality of sensing pixel units 201A such as M*N sensing pixel units. Each sensing pixel unit 201A comprises the photodiode 105, the buffer transistor 110, the transfer transistor 115, the storage capacitor 120, the read transistor 125, the row select transistor 130, the row reset transistor 140, and the column control transistor 135 wherein the transfer transistor 115 and column control transistor 135 are connected in series. The column control transistor 135 is used as a switch which can be switched to be open or closed in accordance with a column control signal COL corresponding to the sensing pixel unit 201A. For example, after the subsequent analog receiving circuit has received and stored the charge of a sensing signal of the sensing pixel unit 201A, the charge reset operation can be performed for the sensing pixel unit 201A to obtain the charge of a corresponding reset signal, and a second capacitor (not shown in FIG. 2) is employed for receiving the charge of such corresponding reset signal. When the row reset signal RST controls the row reset transistor 140 to be conductive, the column control signal COL controls the column control transistor 135 to be conductive to reset the sensing pixel unit 201A. In this situation, the column control transistor 135 receives the reference reset signal (i.e. VDD) transmitted through the buffer transistor 110 and transfer transistor 115. The column control transistor 135 transmit the reference reset signal to the storage capacitor 120, and then the reference reset signal is read out through the read transistor 125 and row select transistor 130 and is outputted to the subsequent analog receiving circuit such as the above-mentioned second capacitor. Instead, even when the row reset signal RST controls the row reset transistor 140 to be conductive, the column control signal COL can be arranged to control the column control transistor 135 to be nonconductive, to not transmit the reference reset signal to the storage capacitor 120 through the buffer transistor 110 and transfer transistor 115 thereby not resetting the sensing pixel unit 201A. It should be noted that the control signals RST, COL, ROW, and RSEL of each of the sensing pixel units 201A can be generated by the processing circuit 102.

The subsequent analog receiving circuit employs a set of two capacitors (including first and second capacitors) to receive and store the charge of a sensing signal and the charge of a reset signal of a sensing pixel unit. The charge of sensing signal and the charge of reset signal can be converted into two digital values by an analog-to-digital conversion circuit, and then the two digital values can be stored in a memory device. Thus, the charges previously stored in the first and second capacitors mentioned above can be cleared and used to receive and store the charge of a sensing signal and the charge of a reset signal of a next sensing pixel unit. In this way, the analog receiving circuit corresponding to the embodiment of image sensor 200 can be implemented by using only one set of two capacitors to respectively receive the charges of sensing signals and reset signals of different sensing pixel units on the same row one pixel; unit by one pixel unit, without using N sets of capacitors to simultaneously receive the charges of sensing signals and reset signals of different sensing pixel units on the same row.

In addition, in the embodiment, a simplified signal diagram for illustrating the operations of image sensor 200 shown in FIG. 2 to perform charge reset operations upon two different sensing pixel units on the same row is similar to FIG. 4, and it is not detailed for brevity.

In addition, in other modification embodiments, for example, the column control transistor 135 can be configured to be connected between the output of buffer transistor 110 and the transfer transistor 115, and the transfer transistor 115 can be configured to be connected between the column control transistor 135 and a terminal of storage capacitor 120. The modifications also fall within the scope of the invention.

Figure 3:
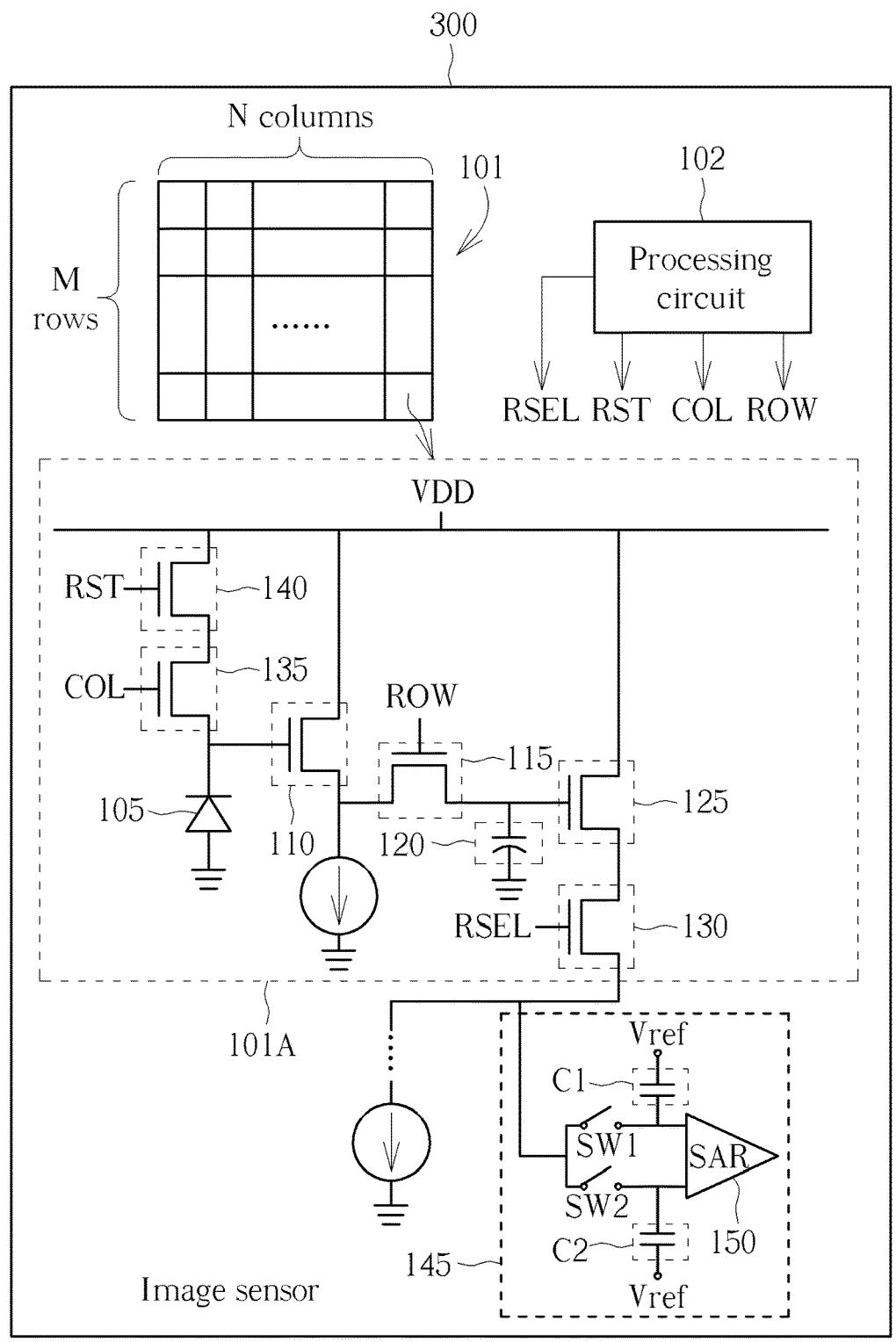
FIG. 3 is a circuit diagram of image sensor according to a third embodiment of the invention.

Further, the image sensors in the first and second embodiments can be designed to further comprise an analog-to-digital conversion circuit. Refer to FIG. 3, FIG. 3 is a circuit diagram of image sensor 300 according to a third embodiment of the invention. For example, in addition to the circuit elements shown in FIG. 1, the image sensor 300 further comprises an analog-to-digital conversion circuit 145 which comprises a first switch SW1, a second switch SW2, a first sample capacitor C1, a second sample capacitor C2, and a successive approximation register (SAR) circuit 150. The analog-to-digital conversion circuit 145 is coupled to the second terminal of row select transistor 130. The analog-to-digital conversion circuit 145 is arranged to use the first sample capacitor C1 to temporarily store the charge of a sensing signal when the switch SW1 is closed, and is arranged to use the second sample capacitor C2 to temporarily store the charge of a reset signal when the switch SW2 is closed. Then, the SAR circuit 150 is used to compare the charges respectively stored in the capacitors C1 and C2 to decrease or reduce the fixed pattern noise generated due to transistor manufacturing process drifts. It should be noted that using the SAR circuit 150 to compare two signal charges is not intended to be a limitation; in other embodiments, other different analog circuit mechanisms can be utilized for performing the comparison of the two signal charges. Further, compared to the conventional scheme using a correlated double sampling (CDS) circuit to access the charges of sensing signals and the charges of reset signals, the first sample capacitor C1 and second sample capacitor C2 included within the analog-to-digital conversion circuit 145 are directly used as the first capacitor and second capacitor in the above first embodiment or second embodiment to access the charges of sensing signals and the charges of reset signals. By doing so, in the embodiments of the invention, the above CDS circuit used by the conventional scheme is not required. The embodiments can use only one set of two capacitors to access signal charges without multiple sets of capacitors. This meets the demand trends of smaller circuit size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An image sensor, comprising:
    a plurality of sensing pixel units, a sensing pixel unit comprising:
        a photodiode, configured for converting light to generate a sensing signal;
        a row reset transistor, having a first terminal coupled to a reference reset signal, a second terminal coupled to the photodiode, and a control terminal which is controlled by a row reset signal;
        a buffer transistor, having a control terminal coupled to an output of the photodiode to receive and buffer the sensing signal;
        a storage capacitor, electrically connected between the buffer transistor and a ground level, configured for temporarily storing charge of the sensing signal; and
        a column control transistor, electrically connected to the control terminal of the buffer transistor or an output of the buffer transistor, configured as a switch which is switched to become open or closed according to a column control signal corresponding to the sensing pixel unit, the column control transistor being used for controlling whether to transfer charge of the reference reset signal into the storage capacitor when the row reset transistor is conductive; and
    a processing circuit, coupled to the sensing pixel units, configured for generating the row reset signal and the column control signal.

2. The image sensor of claim 1, wherein the column control transistor and the row reset transistor are connected in series; the column control transistor is coupled between the reference reset signal and the row reset transistor; and, the row reset transistor is coupled between the column control transistor and the control terminal of the buffer transistor.

3. The image sensor of claim 1, wherein the column control transistor and the row reset transistor are connected in series; the row reset transistor is coupled between the column control transistor and the reference reset signal; and, the column control transistor is coupled between the row reset transistor and the control terminal of the buffer transistor.

4. The image sensor of claim 1, wherein the sensing pixel unit further comprises:
    a transfer transistor, having a control terminal coupled to and controlled by a row control signal, and having a first terminal coupled to the output of the buffer transistor and a second terminal electrically connected the storage capacitor;
    wherein the column control transistor and the transfer transistor are connected in series; the column control transistor is coupled between the output of the buffer transistor and the transfer transistor; and, the transfer transistor is coupled between the column control transistor and the storage capacitor, the row control signal being generated by the processing circuit.

5. The image sensor of claim 1, wherein the sensing pixel unit further comprises:
    a transfer transistor, having a control terminal coupled to and controlled by a row control signal, and having a first terminal coupled to the output of the buffer transistor and a second terminal electrically connected to the storage capacitor;
    wherein the column control transistor and the transfer transistor are connected in series; the transfer transistor is coupled between the column control transistor and the output of the buffer transistor; and, the column control transistor is coupled between the transfer transistor and the storage capacitor, the row control signal being generated by the processing circuit.

6. The image sensor of claim 1, wherein the sensing pixel unit further comprises:
- a read transistor, having a control terminal coupled to the storage capacitor; and
- a row select transistor, having a control terminal and controlled by a row select signal, and having a first terminal coupled to an output terminal of the read transistor, the row select signal being generated by the processing circuit.

7. The image sensor of claim 6, wherein when the row select signal selects a row corresponding to the sensing pixel unit, the column control signal controls the column control transistor to become open, and the charge of the sensing signal temporarily stored in the storage capacitor is read out through the read transistor and the row select transistor; and then the column control signal controls the column control transistor to become closed, to make the column control transistor transfer the charge of the reference reset signal to the storage capacitor so that the charge of the reference reset signal is readout through the read transistor and the row select transistor.

8. The image sensor of claim 6, further comprising:
- an analog-to-digital conversion (ADC) circuit, having a first sample capacitor and a second sample capacitor, the ADC circuit being coupled to a second terminal of the row select transistor and configured for using the first sample capacitor to temporarily store the charge of the sensing signal and using the second sample capacitor to temporarily store the charge of the reference reset signal.

9. A sensing pixel array used in an image sensor, comprising:
- a plurality of sensing pixel units, a sensing pixel unit comprising:
  - a photodiode, configured for converting light to generate a sensing signal;
  - a row reset transistor, having a first terminal coupled to a reference reset signal, a second terminal coupled to the photodiode, and a control terminal controlled by a row reset signal;
  - a buffer transistor, having a control terminal coupled to an output of the photodiode to receive and buffer the sensing signal;
  - a storage capacitor, coupled between the buffer transistor and a ground level, configured for temporarily storing charge of the sensing signal; and
  - a column control transistor, electrically connected to the control terminal of the buffer transistor or an output of the buffer transistor, configured as a switch used to be switched to be open or closed according a column control signal corresponding to the sensing pixel unit, to control whether to transfer charge of the reference reset signal to the storage capacitor when the row reset transistor is conductive.

10. The sensing pixel array of claim 9, wherein when a row select signal selects a row corresponding to the sensing pixel unit, the column control signal controls the column control transistor to be open, and the charge of the sensing signal temporarily stored in the storage capacitor is read out through a read transistor and a row select transistor; and then the column control signal controls the column control transistor to be closed, to make the column control transistor transfer the charge of the reference reset signal to the storage capacitor so that the charge of the reference reset signal is readout through the read transistor and the row select transistor.

* * * * *